United States Patent [19]

Müenz et al.

[11] 4,283,485
[45] Aug. 11, 1981

[54] CONDUCTOR CROSSOVERS FOR INTEGRATED RC-CIRCUITS

[75] Inventors: Wolf-Dieter Müenz, Freigericht; Hans W. Pöetzlberger, Munich, both of Fed. Rep. of Germany

[73] Assignee: Siemens Aktiengesellschaft, Berlin & Munich, Fed. Rep. of Germany

[21] Appl. No.: 40,703

[22] Filed: May 21, 1979

[30] Foreign Application Priority Data

May 31, 1978 [DE] Fed. Rep. of Germany ....... 2823881

[51] Int. Cl.$^3$ ............... C25D 11/02; C25D 11/34; H05K 3/06
[52] U.S. Cl. .................... 430/314; 204/15; 204/38 A; 29/847; 427/80; 427/96; 427/101; 361/410; 430/317; 430/318; 430/319
[58] Field of Search ............... 204/15, 38 A; 29/847; 427/80, 96, 101; 430/314, 317, 318, 319; 361/410

[56] References Cited

U.S. PATENT DOCUMENTS 3,949,275  4/1976  Müenz ..................... 156/665
4,200,502  4/1980  Müenz et al. ............. 204/15

FOREIGN PATENT DOCUMENTS 2506065  10/1977  Fed. Rep. of Germany.

OTHER PUBLICATIONS

Pötzlberger, "Thin Film Integrated RC-Networks with Compensated Temperature Coefficients of R and C" Electro Component Science and Technology, 1977, vol. 4, pp. 139–142.

*Primary Examiner*—John D. Smith
*Attorney, Agent, or Firm*—Hill, Van Santen, Steadman, Chiara & Simpson

[57] ABSTRACT

A method is disclosed for the manufacture in electric thin film R and RC circuits of a conductor crossover. A first conductor is structured at the crossover from a TaAl double layer. A portion of the top layer of the double layer is converted to a TaAl oxide and an SiO$_2$ layer is then applied over the TaAl oxide as a double dielectric. A second conductor is then structured over the double dielectric.

6 Claims, 3 Drawing Figures

CONDUCTOR CROSSOVERS FOR INTEGRATED RC-CIRCUITS

BACKGROUND OF THE INVENTION

The invention relates to the use of a method for the manufacture of an electric thin film circuit according to the Muenz et al U.S. Pat. No. 4,200,502 issued Apr. 29, 1980 incorporated herein by reference for the manufacture of conductor crossovers with TaAl/SiO$_2$ capacitors having as low a capacitance as possible.

The above noted patent application relates to a method for the manufacture of an electric thin layer circuit which comprises at least one capacitor and a conductor and/or resistance. In order to form these circuit elements on an insulating substrate, first a layer of a tantalum-aluminum alloy with a tantalum fraction of between 30 and 70 gram-atomic %, and subsequently an additional layer of a tantalum-aluminum alloy with a tantalum fraction on the order of magnitude between 2 and 20 gram-atomic % are applied. Then, by means of a first mask and etching technique, at the location of a capacitor to be formed, an interruption in both tantalum-aluminum layers is introduced. In order to produce a two-layer capacitor-dielectric, the tantalum-aluminum layers in the capacitor region are anodically oxidized and a silicon-dioxide layer is applied on the resulting tantalum-aluminum oxide layer. In a second masking and etching technique areas of the two-layer capacitor dielectric not required are removed as well as the tantalum-aluminium layer with the lower tantalum fraction. Finally, by means of an additional mask and etching technique, an electrically highly conductive surface layer is produced on the capacitor-dielectric such as in the region of conductors.

The problem solved in the above noted patent application is in disclosing for electric thin layer circuits a means for further reduction in the total number of masks required for the manufacture of the thin layer circuits. The solution according to the above mentioned patent application is that in a method of the type described in the introduction, with the aid of the first mask and etching technique, additionally the regions of both tantalum-aluminum layers lying outside the circuit element regions are etched away. Then the exposed surfaces of the tantalum-aluminum layers are anodically oxidized over the entire surface and covered with the silicon-dioxide layer applied over the entire surface. The regions of the silicon-dioxide layer which are not required are removed with the aid of a second mask and etching technique. The regions of the tantalum-aluminum-oxide layer and the tantalum-aluminum layer with a low tantalum concentration which are not needed are selectively etched off by utilizing the remaining silicon-dioxide layer as the etching mask. Subsequently, the surface layer is applied.

For the completion of the electric circuits with the aid of the thin film technique, installation locations for hybrid components are most often provided which are connected in separate working steps with the thin film circuit. For economic reasons, an optimum surface use of the thin film circuit is always strived for. Its dimensions are essentially determined by technologically-conditioned properties (surface resistance, surface capacitance) and by the wiring of the thin film components with one another necessary for this circuit, and with the connections leading to the exterior.

Conductor crossovers are constructed from a first "lower" electrically conductive layer, an electrically insulating layer, and a second "upper" electrically conductive layer or layer sequence. Viewed perpendicularly to the substrate surface, crossing points are obtained for two conductors electrically insulated from one another which are known as conductor crossovers. The latter can, as is known, be realized in different techniques.

The TaAl double layer technique, known from U.S. Pat. No. 3,949,275 (German OS No. 2,331,586) incorporated herein by reference, permits the manufacture of TaAl resistances and TaAl-oxide capacitors on a substrate. Through the introduction of a sandwhich-dielectric consisting of TaAl-oxide and SiO$_2$ of specified layer thickness, the temperature coefficients of resistances and capacitors can be compensated such as is described in German OS No. 2,506,065 incorporated herein by reference. A manufacturing method for this purpose is described in the German patent application No. P 26 53 814.7 incorporated herein by reference.

SUMMARY OF THE INVENTION

It is an object of the present invention to further develop the idea disclosed in the above noted U.S. Pat. No. 4,200,502 for intergrating conductor crossovers in RC circuits. According to the invention, this is achieved through use of a method for the manufacture of conductor cross-overs with TaAl/SiO$_2$-capacitors having as low as possible a capacitance. In this manner, it is possible, in applying the TaAl/SiO$_2$-RC technology, to manufacture, for example, active filter networks very economically, since no additional process is required.

In the method of the invention, as shown in FIGS. 1 and 3 the "lower" crossunder conductor path leads 13 are formed by a conductor layer 5 (for example TiPdAu) which is underlaid with a TaAl I layer 1 (i.e. TaAl layer with high tantalum fraction) serving as a base. A portion of a TaAl-double layer (layers 1 and 2) is provided in the crossover region 10. The crossing-over conductor path leads 14 are constructed from a conductor layer 5 likewise underlaid with a TaAl I base layer 1 outside the crossing region 10. A piece of conductor layer 5 only is present as the crossover path 11 in the crossing region 10. The insulating layer consists of the TaAl-oxide/SiO$_2$ sandwich dielectric (layers 3 and 4). In this manner, a very flexible circuit layout is obtained. It is possible to accommodate more cross-linked layouts. In the case of conductor structures having a width of 100 $\mu$m, there results, with the surface capacitance of 10 nF/cm$^2$, a capacitance of 1 pF between the crossunder and crossover paths of the conductor crossover region.

In accordance with an additional method (embodiment No. 2) of the invention, stray capacitances of 0.1 pF can be obtained if, prior to a specified structuring of the dielectric, an additional layer, preferably consisting of polyimide, is applied in the crossover region. This polyimide can be applied and structured with the silk screen printing process or in the form of a photo-crosslinkable film. In the case of this variant, the preceding and the following processes correspond to that of embodiment 1. The advantage of this method is that the capacitance of the conductor crossovers is less by approximately the factor of 10. Moreover, the polyimide can be applied in a simple process. The additional sandwich-dielectric, in addition, effects a greater reliability.

Solutions were hitherto disclosed as to how conductor crossovers can be integrated in temperature-compensated TaAl/SiO$_2$ RC-circuits. It is also possible to realize applications for non-temperature compensated RC-circuits or pure R-circuits where conductor crossovers are likewise to be integrated. In utilizing the TaAl-double layer technique in conjunction with a polyimide insulating layer, two additional embodiments for the manufacture of conductor crossovers are possible for these specific instances according to the invention.

For non-temperature-compensated TaAl RC-networks (embodiment No. 3) the RC method sequence is performed without an SiO$_2$-dielectric, whereby the insulating layer consists of TaAl-oxide-polyimide. In this manner, it is possible to arrange the capacitors substantially more densely if no temperature compensation is required. Thus, circuits with greater area capacity can be obtained.

In accordance with a further embodiment of the invention (embodiment No. 4), for pure resistance networks, for the purpose of integrating conductor crossovers, the coating with polyimide at the crossover locations can occur after the application and structuring or shaping of the TaAl-double layer, and the insulating layer can consist solely of polyimide. The etching-off of the TaAl II layer (i.e. TaAl layer with low tantalum fraction) can proceed here after the vapor-deposition and structuring or shaping of the conductor layer, which are then underlaid with the TaAl double layer. Through the omission of thin film capacitors which are not required, the manufacture process is shortened, whereby resistance networks and conductors are included.

In summary, it can be stated that the four sample embodiments according to the invention render possible the integration of conductor crossovers in thin film R and RC networks. The application of the TaAl-double layer technique in conjunction with the TaAl/SiO$_2$-technology, which is introduced for temperature-compensated RC-networks, therefore becomes even more attractive.

DESCRIPTION OF THE PREFERRED EMBODIMENTS

Figure 1:
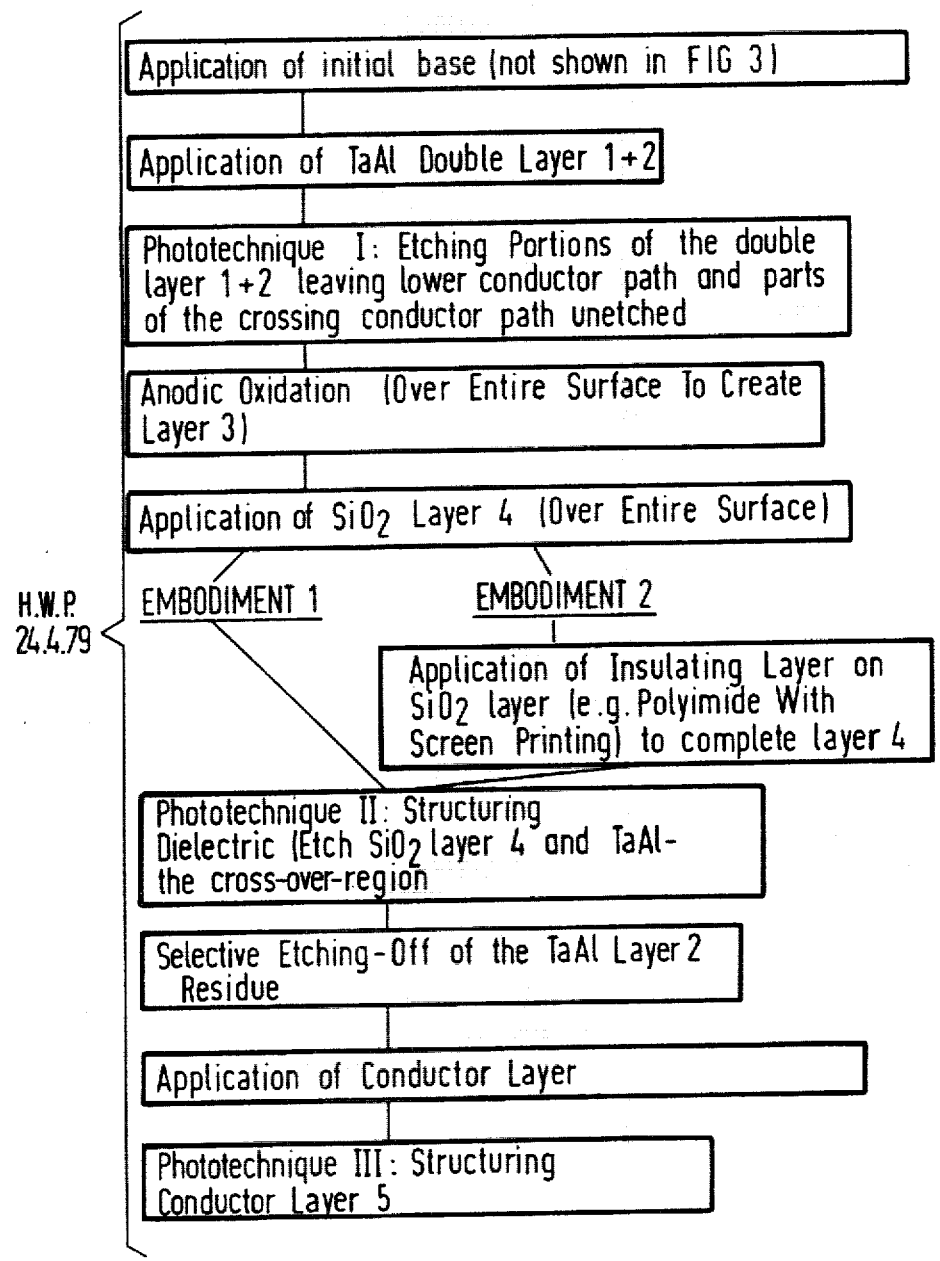
FIG. 1 illustrates the manufacture sequence of TaAl/SiO$_2$ (embodiment 1) and TaAl/SiO$_2$-polyimide (embodiment 2) conductor crossovers.

According to FIG. 1 an insulating base is provided as initial base, which, for example, can be produced by means of applying an oxide onto a non-conducting carrier. One can also proceed from a completed insulating base, which, for example, consists of glass, quartz, sapphire or a fine-grained polished ceramic. Onto that base, which is not shown in FIG. 3 a TaAl double layer (high tantalum content TaAl type I layer 1 and low tantalum content TaAl type II layer 2) is applied. The application of the tantalum-aluminum alloy double layers proceeds in a manner which is known per se, for example, by means of cathode sputtering.

The double layer thus prepared is now covered with a mask which e.g. can be manufactured photolithographically with the aid of a positively acting photoresist. The mask manufacture is designed by phototechnique I. The mask covers all the areas corresponding with the capacitor base electrode represented by the crossunder path 12 of the cross-over capacitor and also covers the leads 13 and 14 of the crossunder and crossover paths 12 and 11 respectively to be produced so that the remaining regions of the tantalum-aluminum alloy double layer I + II (layers 1 and 2) can be etched off by one etching step or by two successive etching steps. In the case of two successive selective etching steps, an under-etching of the tantalum-aluminum-alloy double layer I + II is avoided.

After the removal of the mask formed by the phototechnique I, an anodic oxidation over the entire surface is carried out in which the surface region or zone of the tantalum-aluminum alloy layer 2 is converted into a tantalum-aluminum-oxide layer 3. In the interruption or break bordering on or adjacent to the capacitor zone (crossover region 10), the tantalum-aluminum-oxide layer 3 also preferably extends over the free frontal face of the tantalum-aluminum-alloy double layer I + II 1 + 2. Following the anodic oxidation, a silicon-dioxide layer 4 is applied, preferably by means of cathode sputtering, over the entire surface.

In embodiment 1, there immediately follows at this location photo-technique II, whereas in the case of embodiment 2, an insulating layer, e.g. polyimide, is additionally applied by means of screen printing. Aside from this exception, the manufacturing sequence for embodiments 1 and 2 again proceeds in common manner, namely, a second mask is applied, which is preferably manufactured photolithographically with the aid of a positively acting photoresist. This mask manufacture is designated by photo-technique II. The second mask covers the dielectric zone of the capacitor i.e. the crossover region 10 to be produced, so that the remaining zones of the silicon-dioxide layer 4 and of the tantalum-aluminum-oxide layer 3 outside a desired crossover region 10 can be etched off by two successive selective etching steps. The structuring or shaping of the silicon-dioxide layer 4 can also be conducted by a wet-chemical process. However, it preferably proceeds by means of plasma etching. A corresponding structuring or shaping of the tantalum-aluminum-oxide layer 3 takes place after removal of the second photomask by a wet-chemical process. In this etching operation, the remaining silicon-dioxide layer 4 serves as the etching mask.

After this etching operation, in an additional selective etching operation, the tantalum-aluminum layer 2-residue outside the cross-over region 10 is etched off, whereby the remaining silicon-dioxide layer 4 again serves as the etching mask.

In the following method step, an electrically highly conducting layer 5, preferably of TiPdAu is applied over the entire surface. This application is performed e.g. by means of successively proceeding vapor-deposition.

In the last method step, the surface layer 5 is structured or shaped. For this purpose, a third mask is applied on the layers which is manufactured e.g. photolithographically with the aid of a positively acting photoresist. This mask manufacture is designated by photo-technique III. The third mask covers the crossover path 11 of the crossover region 10 and the leads 13 and 14 of the crossover and crossunder paths 11 and 12, so that the remaining regions of the TiPdAu layer 5 can be etched off. After these selective etching operations, only the third mask need be removed for the purpose of finishing the thin film circuit crossover. The manufacturing sequence of conductor crossovers according to embodiments 3 and 4 is apparent from the operating sequence diagrams illustrated in FIG. 2.

Figure 2:
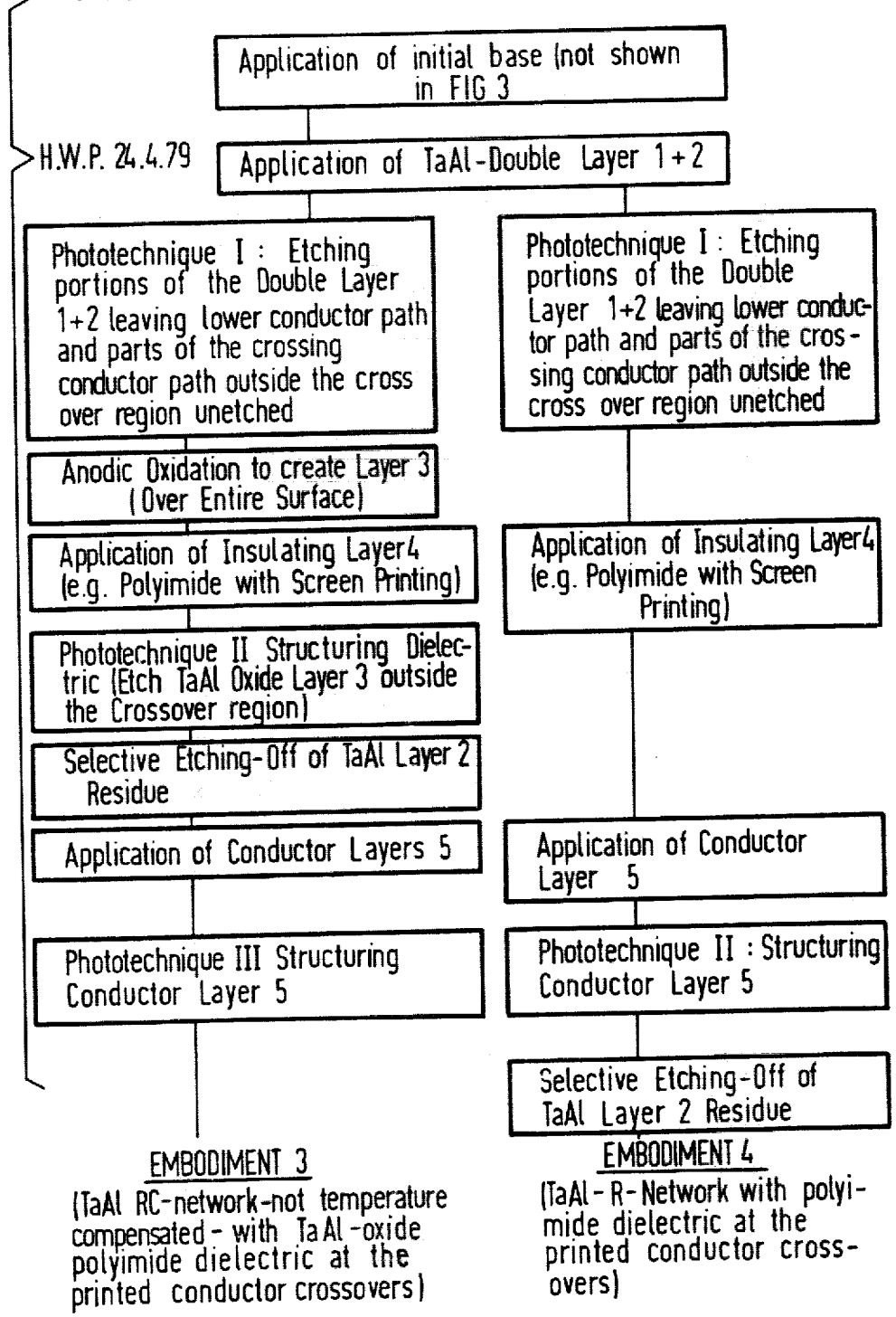
FIG. 2 illustrates the manufacture sequence of conductor crossovers according to embodiments 3 and 4.
Figure 3:
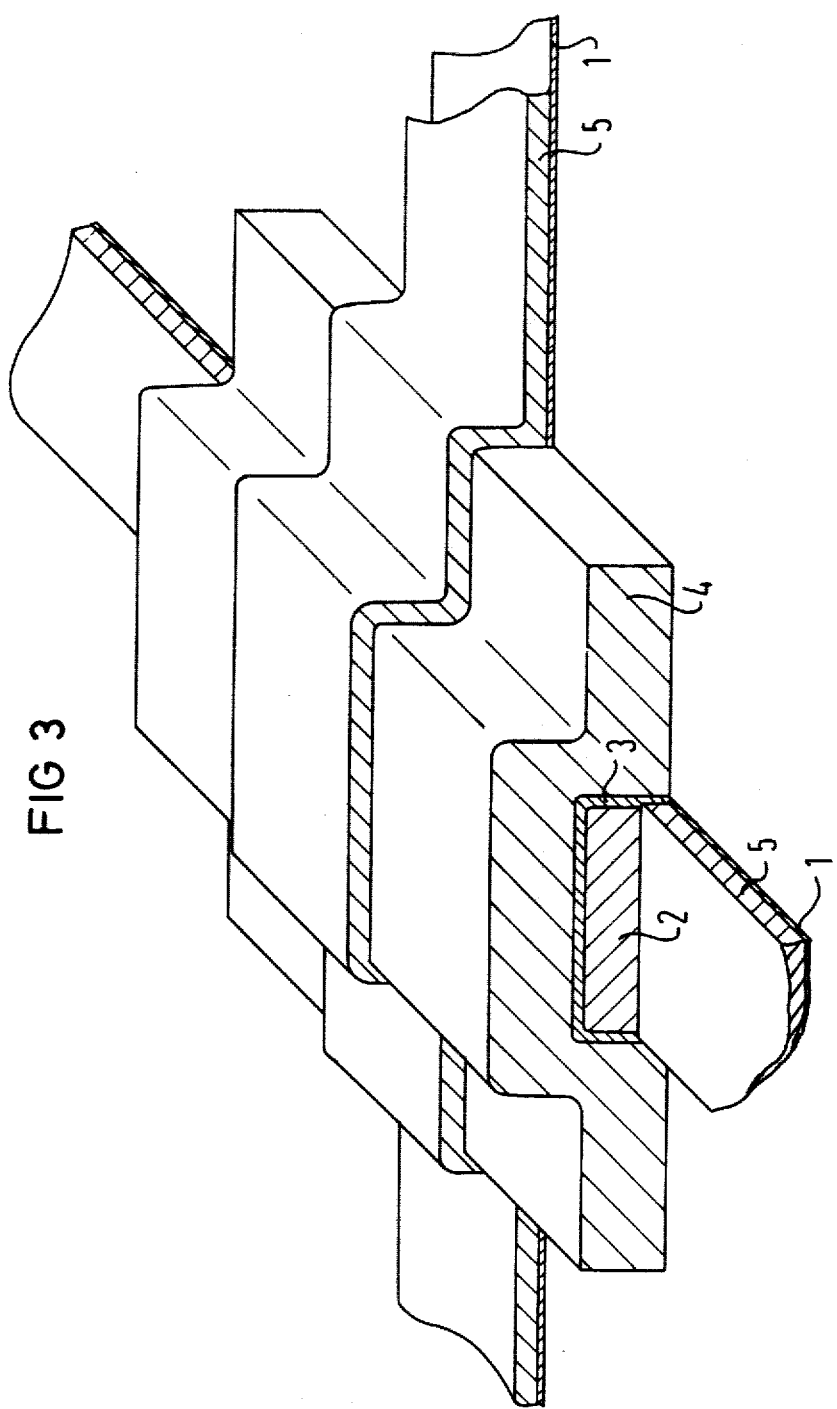
FIG. 3 illustrates a basic construction of the conductor crossover for embodiments 1 through 4.

In the third embodiment shown in FIG. 2, the method is the same as the second embodiment except that the $SiO_2$ layer 4 is deleted and the dielectric of the crossover capacitor is formed by the TaAl oxide layer 3 and a polyimide layer 4 as can be seen in FIG. 3. (legend)

| Legend to FIG. 3 | | | |
|---|---|---|---|
| embodiment 1 | embodiment 2 | embodiment 3 | embodiment 4 |
| 1 TaAl I | TaAl I | TaAl I | TaAl |
| 2 TaAl II | TaAl II | TaAl II | TaAl II |
| 3 TaAl-Oxyd | TaAl-Oxyd | TaAl-Oxyd | — |
| 4 $SiO_2$ | $SiO_2$ + Polyimide | Polyimide | Polyimide |
| 5 TiPdAu | TiPdAu | TiPdAu | TiPdAu |

In the fourth embodiment shown in FIG. 2, the method is the same as the third embodiment except that the TaAl oxide layer 3 is also deleted and the crossover capacitor dielectric is formed only of polyimide layer 4. Also the etching off of the TaAl layer 2 (low tantalum content) of the double layer can occur after the deposition and structuring of the conductor layer so that the leads 13 and 14 are underlaid with both layers 1 and 2 rather than just layer 1 as in embodiments 1, 2, and 3.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A method for the manufacture of a conductor crossover formed of a crossover region with a crossunder path and a crossover path and leads connecting to the crossover and crossunder paths, all in a thin film integrated circuit, comprising the steps of:
   (a) providing an insulating base and applying a TaAl double layer thereon, the double layer comprising a first bottom TaAl layer of higher tantalum content and a second upper TaAl layer of lower tantalum content;
   (b) in a first photo-technique, masking the desired crossunder path and associated leads and also the desired leads for the crossover path, and then etching away unmasked portions of the double layer;
   (c) oxidizing the remaining portions of the double layer to create a TaAl-oxide layer;
   (d) applying an $SiO_2$ layer over the structure formed thus far;
   (e) in a second photo-technique, masking the desired crossover region and etching off unmasked $SiO_2$ and TaAl-oxide layers;
   (f) using the remaining $SiO_2$ in the crossover region as a mask, etching off unmasked TaAl second layer from the leads of the crossunder and crossover paths;
   (g) applying an electrically highly conductive layer over the structure formed thus far; and
   (h) in a third photo-technique, masking the desired crossover path and the leads of the crossover and crossunder paths and etching away unmasked portions of the conductive layer.

2. A method according to claim 1 wherein following the step of applying the $SiO_2$ layer an additional insulating layer is applied on the $SiO_2$ layer prior to the second photo-technique.

3. A method according to claim 2 wherein the additional insulating layer applied comprises polyimide.

4. A method according to claim 1 wherein the highly conductive layer applied comprises TiPdAu.

5. A method for the manufacture of a non-temperature compensated TaAl RC network having a conductor crossover formed of a crossover region with a crossunder path and a crossover path and leads connecting to the crossover and crossunder paths, all in a thin film integrated circuit, comprising the steps of:
   (a) providing an insulating base and applying a TaAl double layer thereon, the double layer comprising a first portion TaAl layer of higher tantalum content and a second upper TaAl layer of lower tantalum content;
   (b) in a first photo-technique, masking the desired crossunder path and associated leads and also the desired leads for the crossover path, and then etching away unmasked portions of the double layer;
   (c) oxidizing the remaining portions of the double layer to create a TaAl-oxide layer;
   (d) applying a polyimide layer over the structure formed thus far;
   (e) in a second photo-technique, masking the desired crossover region and etching off unmasked polyimide and TaAl-oxide layers;
   (f) using the remaining polyimide in the crossover region as a mask, etching off unmasked TaAl second layer from the leads of the crossunder and crossover paths;
   (g) applying an electrically highly conductive layer over the structure formed thus far; and
   (h) in a third photo-technique, masking the desired crossover path and the leads of the crossover and crossunder paths and etching away unmasked portions of the conductive layer.

6. A method for the manufacture of a resistance network conductor crossover formed of a crossover region with a crossunder path and a crossover path and leads connecting to the crossover and crossunder paths, all in a thin film integrated circuit, comprising the steps of:
   (a) providing an insulating base and applying a TaAl double layer thereon, the double layer comprising a first bottom TaAl layer of higher tantalum content and a second upper TaAl layer of lower tantalum content;
   (b) in a first photo-technique, masking the desired crossunder path and associated leads and also the desired leads for the crossover path, and then etching away unmasked portions of the double layer;
   (c) applying a polyimide layer over the structure formed thus far;
   (d) in a second photo-technique masking the desired crossover region and etching off the unmasked polyimide layer;
   (e) applying an electrically highly conductive layer over the structure formed thus far;
   (f) in a third photo-technique, masking the desired crossover path and the leads of the crossover and crossunder paths and etching away unmasked portions of the conductive layer; and
   (g) using the conductive layer as a mask, etching off unmasked TaAl second layer.

* * * * *